US010615128B2

(12) United States Patent
Dias et al.

(10) Patent No.: US 10,615,128 B2
(45) Date of Patent: Apr. 7, 2020

(54) SYSTEMS AND METHODS FOR ELECTROMAGNETIC INTERFERENCE SHIELDING

(71) Applicant: Intel Corporation, Santa Clara, CA (US)

(72) Inventors: Rajendra C. Dias, Phoenix, AZ (US); Anna M. Prakash, Chandler, AZ (US); Joshua D. Heppner, Chandler, AZ (US); Eric J. Li, Chandler, AZ (US); Nachiket R. Raravikar, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/945,023

(22) Filed: Apr. 4, 2018

(65) Prior Publication Data
US 2018/0226358 A1 Aug. 9, 2018

Related U.S. Application Data

(62) Division of application No. 15/074,050, filed on Mar. 18, 2016, now Pat. No. 9,953,929.

(51) Int. Cl.
*H01L 23/552* (2006.01)
*H01L 23/31* (2006.01)
(Continued)

(52) U.S. Cl.
CPC .......... *H01L 23/552* (2013.01); *H01L 21/565* (2013.01); *H01L 21/78* (2013.01);
(Continued)

(58) Field of Classification Search
None
See application file for complete search history.

(56) References Cited

U.S. PATENT DOCUMENTS

| 5,166,772 A | 11/1992 | Soldner et al. |
| 5,838,551 A | 11/1998 | Chan |

(Continued)

FOREIGN PATENT DOCUMENTS

| JP | 09223761 A | 8/1997 |
| JP | 2014110263 A | 6/2014 |

OTHER PUBLICATIONS

"U.S. Appl. No. 15/074,050, Advisory Action dated Oct. 30, 2017", 3 pgs.

(Continued)

*Primary Examiner* — Wael M Fahmy
*Assistant Examiner* — Sarah K Salerno
(74) *Attorney, Agent, or Firm* — Schwegman Lundberg & Woessner, P.A.

(57) ABSTRACT

Discussed generally herein are methods and devices including or providing an electromagnetic interference (EMI) shielding. A device can include a substrate including electrical connection circuitry therein, grounding circuitry on, or at least partially in the substrate, the grounding circuitry at least partially exposed from a surface of the substrate, a die electrically connected to the connection circuitry and the grounding circuitry, the die on the substrate, and a conductive foil or conductive film surrounding the die, the conductive foil or conductive film electrically connected to the grounding circuitry.

17 Claims, 9 Drawing Sheets

(51) Int. Cl.
  *H01L 21/56* (2006.01)
  *H01L 21/78* (2006.01)
(52) U.S. Cl.
  CPC ................... *H01L 23/3114* (2013.01);
    *H01L 2224/16227* (2013.01); *H01L 2224/97*
    (2013.01); *H01L 2924/15311* (2013.01); *H01L*
    *2924/181* (2013.01)

(56) References Cited

U.S. PATENT DOCUMENTS

| | | | |
|---|---|---|---|
| 6,492,194 | B1 | 12/2002 | Bureau et al. |
| 2002/0089832 | A1 | 7/2002 | Huang |
| 2004/0231872 | A1* | 11/2004 | Arnold ................... H01L 23/04 174/377 |
| 2007/0045829 | A1 | 3/2007 | Jeong et al. |
| 2007/0176281 | A1 | 8/2007 | Kim et al. |
| 2007/0267734 | A1* | 11/2007 | Zhao ................... H01L 21/561 257/687 |
| 2008/0061407 | A1 | 3/2008 | Yang et al. |
| 2009/0236700 | A1 | 9/2009 | Moriya |
| 2010/0172116 | A1 | 7/2010 | Yorita et al. |
| 2011/0233736 | A1* | 9/2011 | Park ................... H01L 25/105 257/659 |
| 2012/0062439 | A1 | 3/2012 | Liao et al. |
| 2017/0018531 | A1 | 1/2017 | Lin et al. |
| 2017/0271270 | A1 | 9/2017 | Dias et al. |

OTHER PUBLICATIONS

"U.S. Appl. No. 15/074,050, Examiner Interview Summary dated Nov. 14, 2017", 3 pgs.
"U.S. Appl. No. 15/074,050, Final Office Action dated Aug. 15, 2017", 9 pgs.
"U.S. Appl. No. 15/074,050, Non Final Office Action dated May 8, 2017", 9 pgs.
"U.S. Appl. No. 15/074,050, Notice of Allowance dated Dec. 20, 2017", 8 pgs.
"U.S. Appl. No. 15/074,050, PTO Response to Rule 312 Communication dated Mar. 16, 2018", 2 pgs.
"U.S. Appl. No. 15/074,050, Response filed Apr. 11, 2017 to Non Final Office Action dated Mar. 17, 2017", 7 pgs.
"U.S. Appl. No. 15/074,050, Response filed Jul. 14, 2017 to Non Final Office Action dated May 8, 2017", 6 pgs.
"U.S. Appl. No. 15/074,050, Response filed Oct. 6, 2017 to Final Office Action dated Aug. 15, 2017", 7 pgs.
"U.S. Appl. No. 15/074,050, Response filed Nov. 15, 2017 to Advisory Action dated Oct. 30, 2017", 7 pgs.
"U.S. Appl. No. 15/074,050, Restriction Requirement dated Mar. 17, 2017", 9 pgs.
"International Application Serial No. PCT/US2017/018408, International Search Report dated May 31, 2017", 3 pgs.
"International Application Serial No. PCT/US2017/018408, Written Opinion dated May 31, 2017", 8 pgs.

* cited by examiner

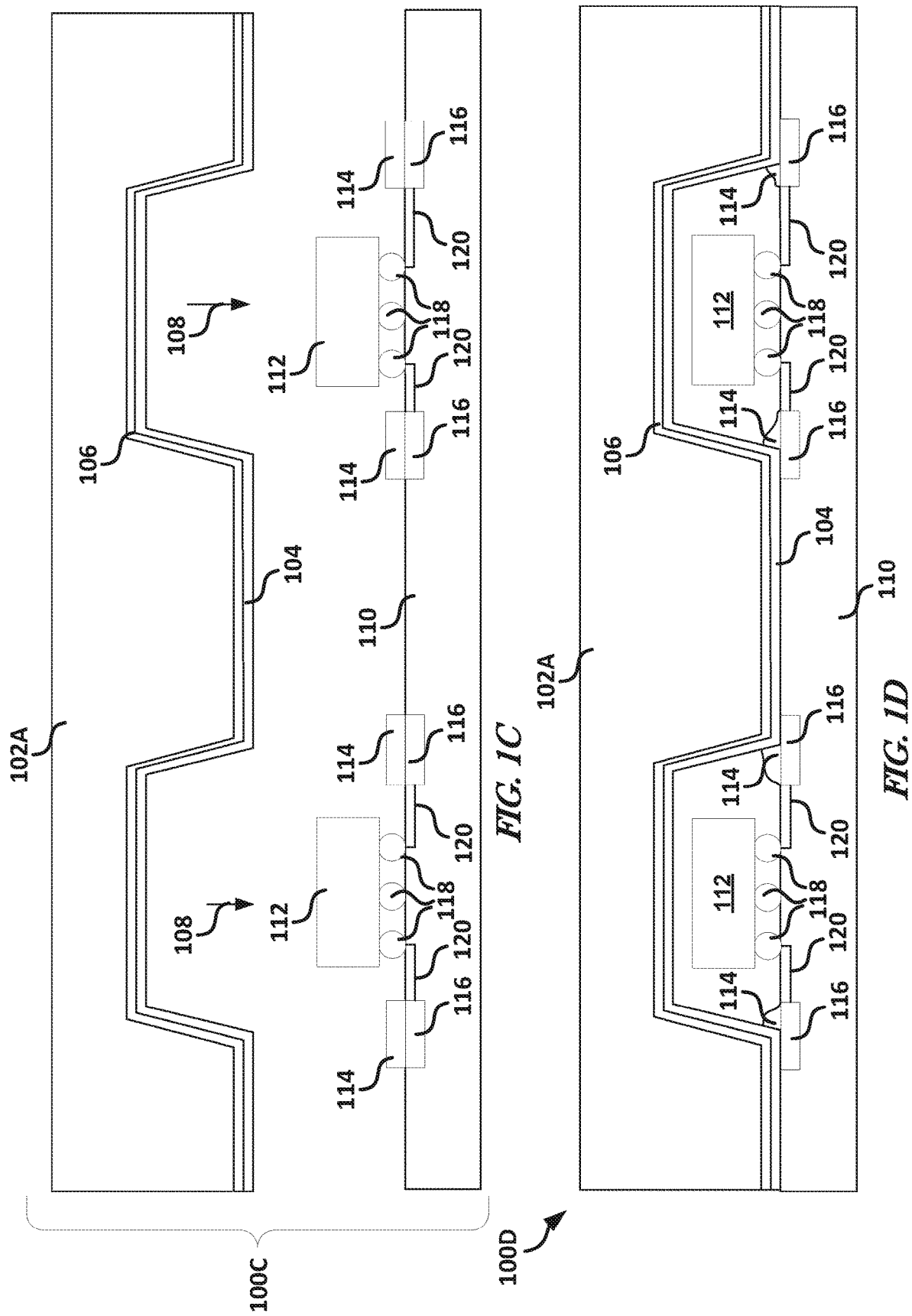

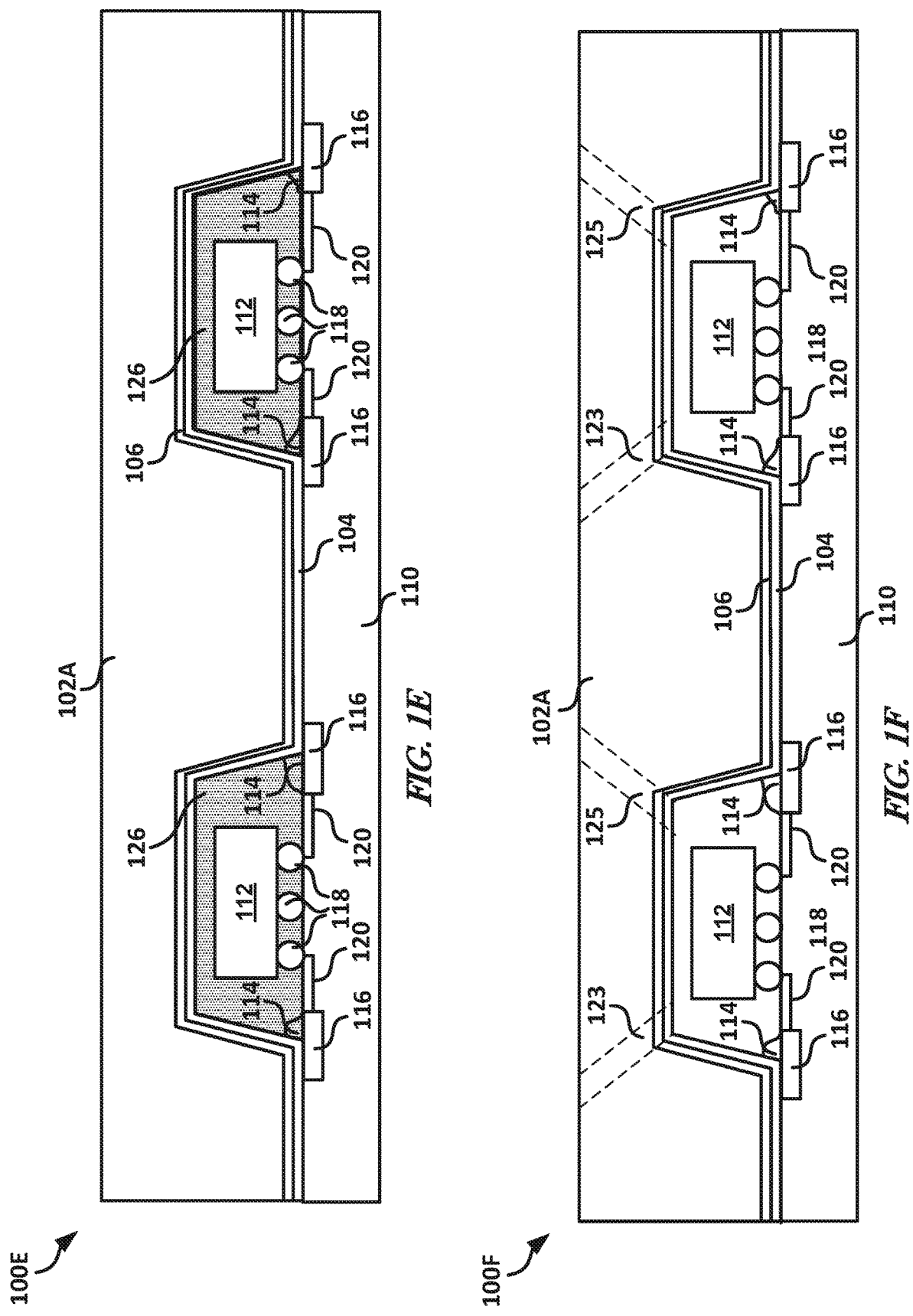

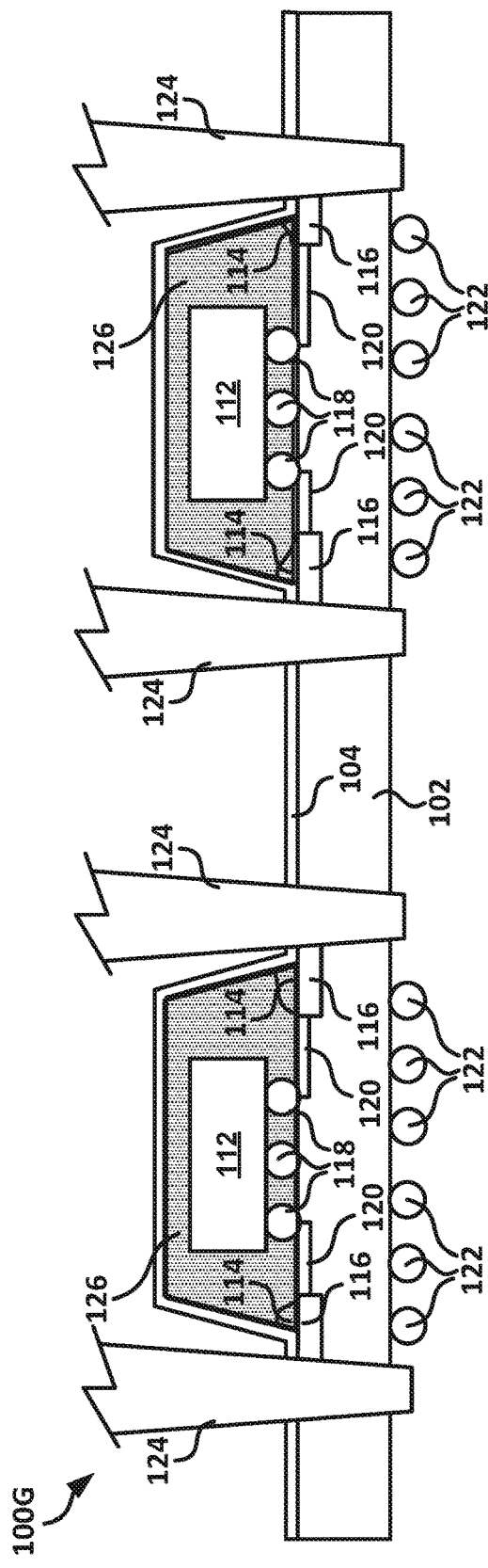
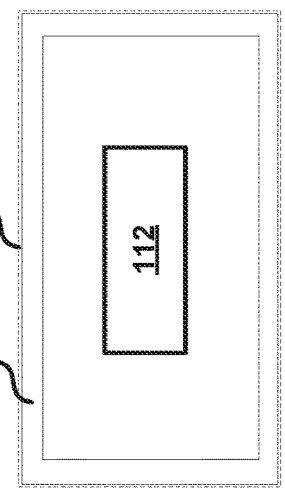
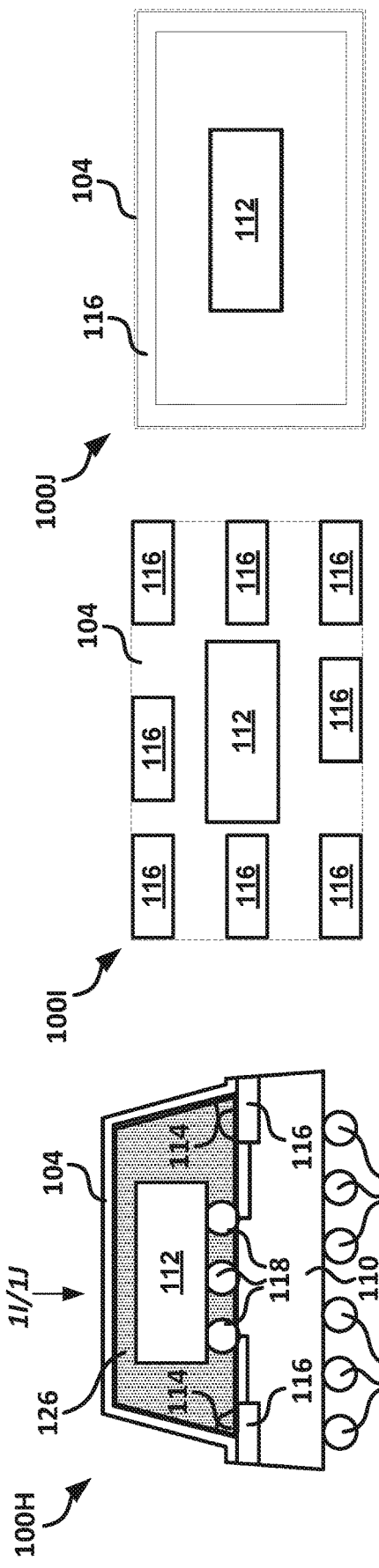
FIG. 1G
FIG. 1H
FIG. 1I
FIG. 1J

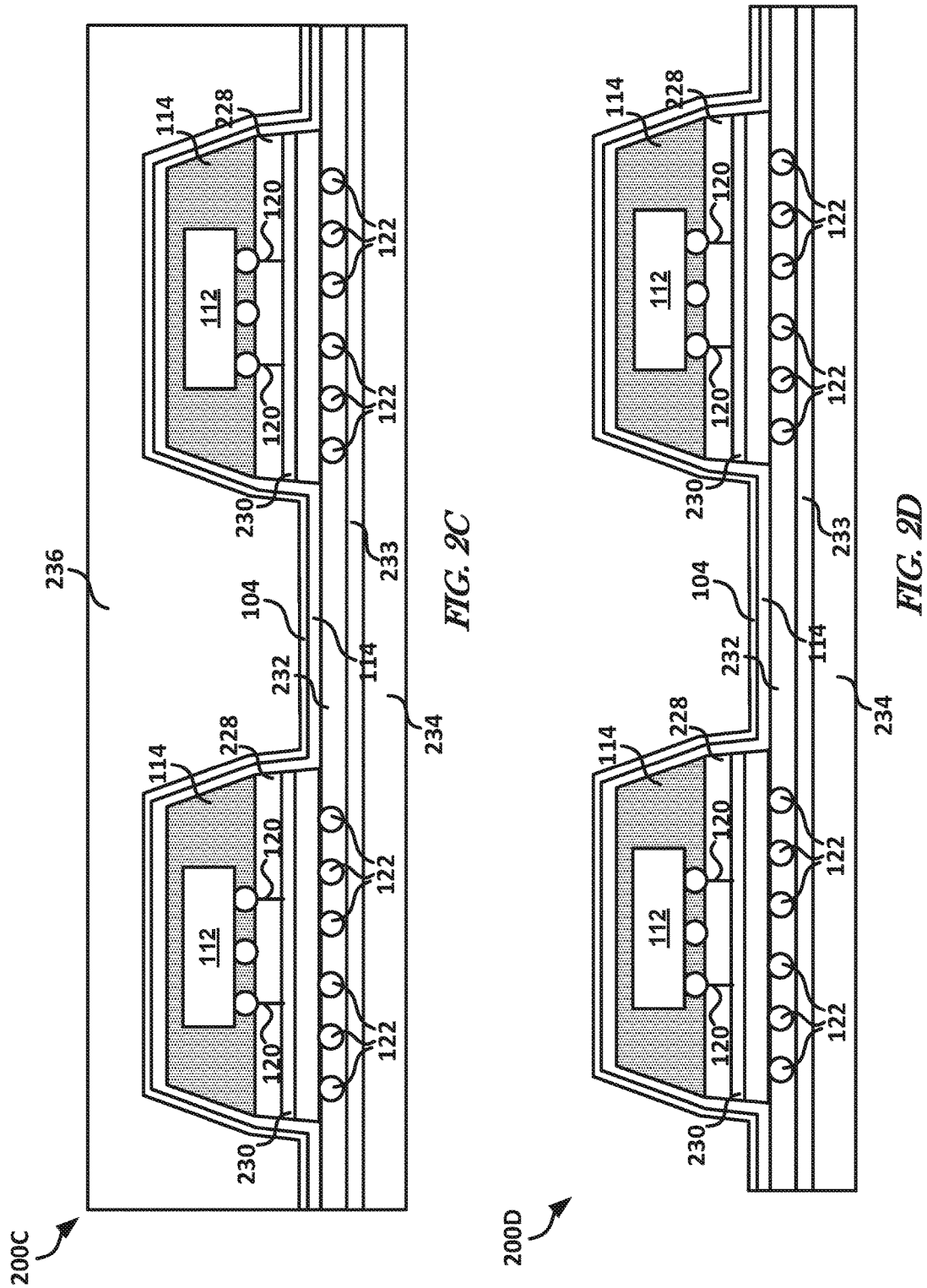

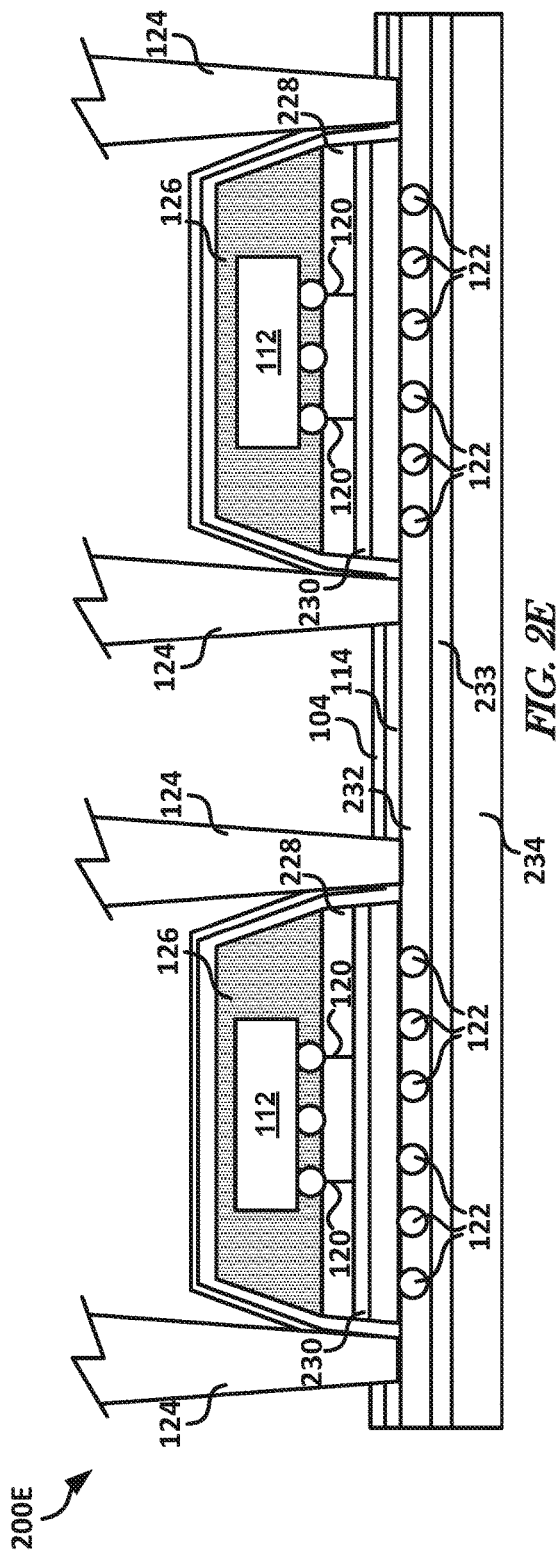
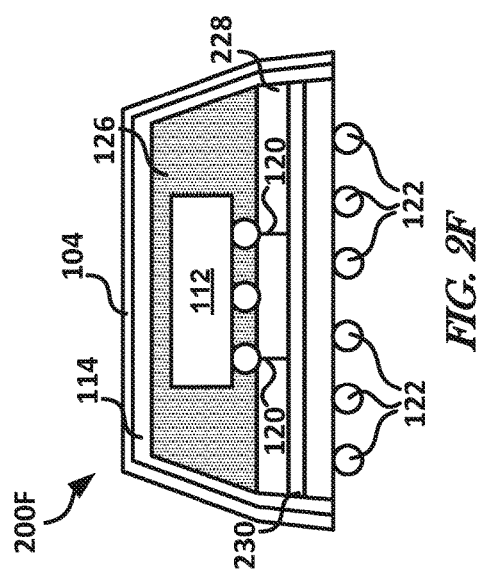

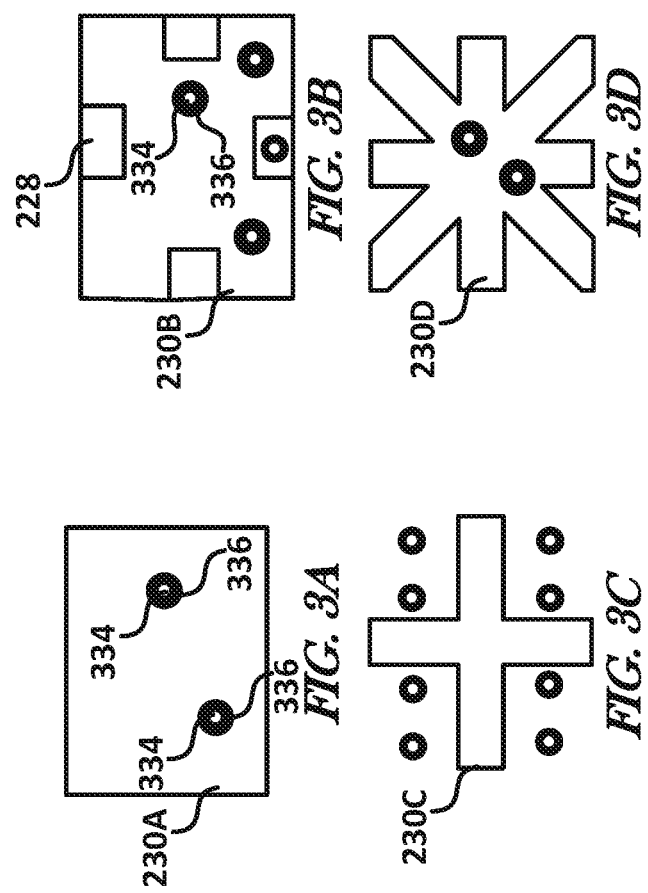

SYSTEMS AND METHODS FOR ELECTROMAGNETIC INTERFERENCE SHIELDING

CROSS-REFERENCE TO RELATED APPLICATION

This application is a divisional of U.S. patent application Ser. No. 15/074,050, filed Mar. 18, 2016, which is incorporated by reference herein in its entirety.

TECHNICAL FIELD

This disclosure relates generally to electromagnetic interference (EMI) shielding. One or more embodiments regard a manufacturing process to provide an EMI shielding for an electronics package. One or more embodiments regard the EMI shielded packages produced using one of the manufacturing processes.

BACKGROUND ART

Electromagnetic sources can generate electrical signals that can cause Electromagnetic interference (EMI). EMI is an electromagnetic wave or signal generated by an external source that negatively affects a circuit. The electromagnetic wave or signal can affect the circuit through electromagnetic induction, electrostatic coupling, and/or conduction. The electromagnetic wave can degrade the performance of the circuit or even stop it from functioning.

BRIEF DESCRIPTION OF THE DRAWINGS

FIGS. 1A-1G illustrate, by way of example, cross-section diagrams of an embodiment of a process for manufacturing a device with EMI shielding.

FIG. 1H illustrates, by way of example, a cross section diagram of an embodiment of a package created using a process discussed with regard to FIGS. 1A-1G.

FIG. 1I illustrates, by way of example, a perspective view diagram of an embodiment of an EMI shielded package created using a process discussed with regard to FIGS. 1A-1G.

FIG. 1J illustrates, by way of example, a perspective view diagram of another embodiment of an EMI shielded package created using a process discussed with regard to FIGS. 1A-1G.

FIGS. 2A-2F illustrate, by way of example, cross-section diagrams of another embodiment of a process for manufacturing a device with EMI shielding.

FIGS. 3A-3D illustrate, by way of example, perspective view diagrams of embodiments of grounding planes.

DESCRIPTION OF EMBODIMENTS

Figure 1A:
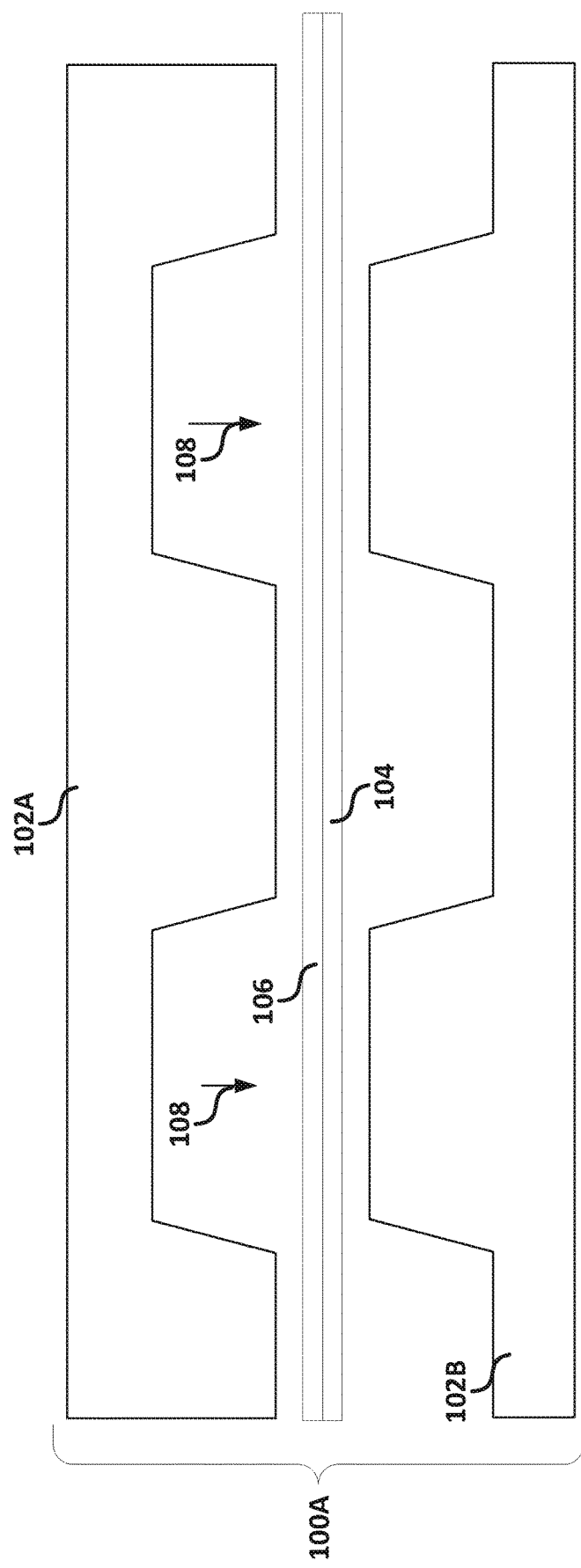

The following description and the drawings sufficiently illustrate embodiments to enable those skilled in the art to practice them. Other embodiments can incorporate structural, logical, electrical, process, or other changes. Portions and features of some embodiments can be included in, or substituted for, those of other embodiments. Embodiments set forth in the claims encompass all available equivalents of those claims.

An EMI shielding for an electronics package (e.g., a molded or unmolded system in package (SiP)) uses a physical vapor deposition (PVD) sputtering process to coat a mold surface with a conductive material. The sputtering process has some disadvantages, such as high cost of the sputtering equipment, increase in throughput time to increase sputtered conductive material thickness, complex process for uniform material coverage on package sidewalls, and mold surface pre clean to improve adhesion, among others.

Embodiments discussed herein provide EMI shielding for an electronic package, such as a system in package (SiP). Generally a metal foil or film is formed around the SiP such that the metal foil contacts one or more ground pads (e.g., on or at least partially in the package surface) or one or more ground traces/planes of the SiP. Two manufacturing techniques (each with multiple variations) are discussed herein. The first process discussed is a manufacturing process for strip-level molded packages. In this process a foil or film is attached to a mold chase prior to mold fill. The second process discussed is a manufacturing process for singulated molded packages. In this process a metal foil or film is stamped, pressed, or otherwise formed around the SiP to make contact with the one or more grounding planes/traces exposed on the sides of the package substrate.

The manufacturing processes discussed herein can provide one or more advantages over prior EMI shielding techniques and/or devices with EMI shielding. An advantage can include avoiding sputtering and the relatively high costs associated therewith. Another advantage can include a reduced throughput time as compared to a sputtering process.

The two manufacturing processes are discussed in turn. The first process, which can be useful for smaller packages normally fabricated using strip-level dies (among others), is discussed with regard to FIGS. 1A-1J. The second process, which can be useful for singulated die packages containing one or more devices (among others), is discussed with regard to FIGS. 2A-2F. In the first process, a conductive foil or film is attached to a mold chase. The foil or film is then attached to ground pads on a package substrate prior to optional molding. In the second process, a package is molded prior to foil or film attach.

A "foil" as used herein is a conductor, such as a substantially pure metal. A "film" as used herein is a combination of a dielectric material (e.g., an organic material) and a conductive material attached to each other. The remaining discussion refers to foils. However, it is to be understood that a film can be used in place of a foil.

FIG. 1A illustrates, by way of example, a cross-section diagram of an embodiment of a system 100A for adhering a foil 104 to a mold chase. The system 100A as illustrated includes a top mold chase 102A, a bottom mold chase 102B, a foil 104, and an adhesive 106.

The top mold chase 102A and the bottom mold chase 102B form a main body of a mold. The mold chase 102A-B is used to form the foil 104 to a shape defined by the top mold chase 102A and the bottom mold chase 102B. The top mold chase 102A and the bottom mold chase 102B include mold cavity registers to help ensure correct alignment of the mold chases 102A-B and to help ensure the foil 104 is formed to a desired shape.

The foil 104 can include a pliable (e.g., bendable, foldable, deformable, or the like) conductive material, such as copper, aluminum, gold, titanium, silver, stainless steel, a laminate conductive material, or a combination thereof, among others. A film, which can be used in place of the foil 104, can include a foil attached to another layer of material, such as can include an organic material, such as polypropylene, polyethylene terephthalate, and/or polyethylene, among others. The organic material of the film can be chosen for its bonding characteristics (its ability to be attached to the top mold chase 102A using the adhesive 106). Such configurations are beneficial when the foil 104 alone does not bond well to the top mold chase 102A.

The adhesive 106 can be a thermal plastic or other adhesive that is pliable. The adhesive 106 generally has a weaker adhesive strength when heated as compared to its adhesive strength at colder temperature. Example adhesives include glue(s), pressure sensitive adhesives, spray adhesives, fabric adhesives, epoxy, and polyurethane, among others.

The adhesive 106 is situated on the foil 104. The foil 104 and adhesive 106 combination is situated between the top mold chase 102A and the bottom mold chase 102B. The top and bottom mold chases 102A-B are pressed together in the direction of the arrows 108. The adhesive 106 adheres the foil 104 to the top mold chase 102A. When the bottom mold chase 102B is pulled away from the top mold chase 102A the bond between the adhesive 106, the top mold chase 102A and the foil 104 keeps the foil 104 attached to the top mold chase 102A.

Figure 1B:
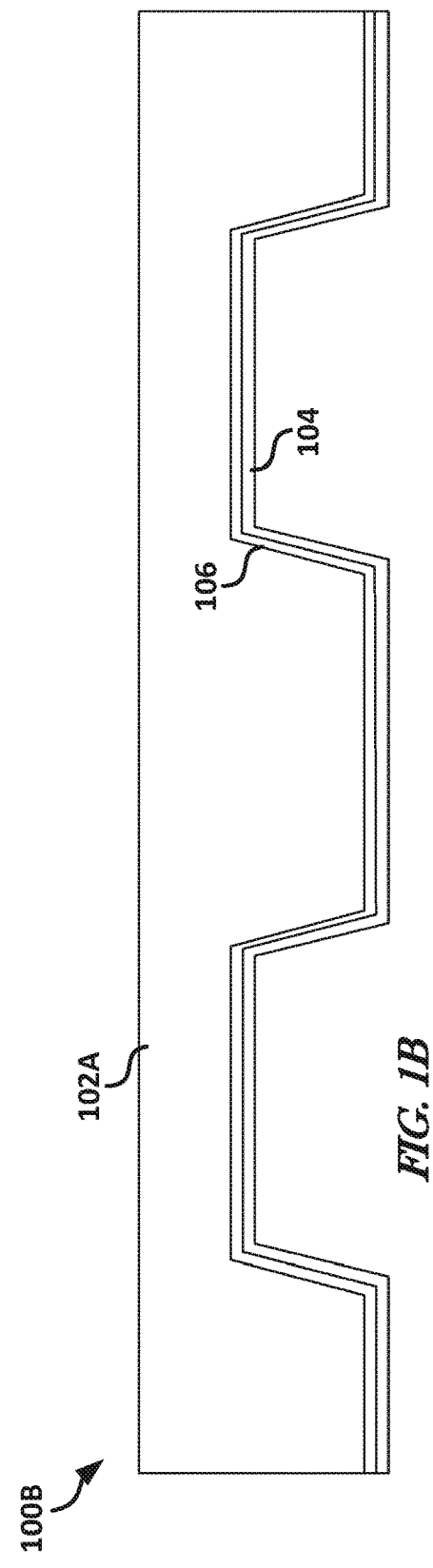

FIG. 1B illustrates a cross-section view diagram of an embodiment of a system 100B that includes the system 100A after the bottom mold chase 102B is pulled away from the top mold chase 102A. As previously discussed, the bond between the adhesive 106, foil 104, and the top mold chase 102A keeps the foil 104 attached to the top mold chase 102A.

FIG. 1C illustrates a cross-section view diagram of an embodiment of a system 100C that includes the system 100B with a strip 110 of packages 112 situated under the top mold chase 102A with the foil 104 attached thereto. The strip 110 includes a plurality of packages 112 attached thereto. The strip 110 is different from a wafer. A wafer is a medium on which dies are formed, while a strip includes packaged dies (i.e. packages) situated thereon or at least partially therein. The strip 110 can include a substrate, such as can include a plurality of build-up layers, such as can include bumpless buildup layers. The substrate can include electrical connection circuitry at least partially therein and/or thereon. The electrical connection circuitry can include one or more traces, vias, or other conductive circuitry to connect to die circuitry in the package 112.

The strip 110 can include traces 120, pads 116, and other circuitry therein to connect to circuitry of the package 112, such as through connections 118. The pads 116 are ground connected, such as to a ground of the package, such as through the trace(s) 120 and/or a ground plane of the strip 110. Each of the pads 116 includes some conductive adhesive 114 thereon. The conductive adhesive can include tin, copper, nickel, gold, indium, silver, antimony, aluminum, oxides thereof, or a composite of a thermosetting epoxy and a metal. In one or more embodiments, the conductive adhesive is a solder. The packages 112 can be flip-chip, wire bond, or otherwise attached to the strip 110, such as through the connections 118.

FIG. 1D illustrates a cross-section view of a system 100D that includes the system 100C after the top mold chase 102A and attached foil 104 have been pressed onto the strip 110. Heat can be applied to the system 100D. The heat can melt the solder or activate the conductive adhesive 114. The heat can reduce a bond between the foil 104 and the adhesive 106, such as to allow the foil 104 to be detached from the top mold chase 102A.

The system 100D can be cooled. Cooling the system 100D can harden the solder or solidify an electrical connection between the conductive adhesive 114 and the foil 104, such as to form a bond between the foil 104 and conductive adhesive 114 that is stronger than the bond between the foil 104 and the adhesive 106. Thus, the foil 104 can remain attached to the pad 116 through the conductive adhesive 114 when the top mold chase 102A is removed therefrom.

FIG. 1E illustrates a system 100E that includes the system 100D after an optional molding material 126 is injected on and around the package 112. The molding material 126 is an insulating material, such as can include epoxy resins that are thermoplastic or thermosets, such as cresol novolac or bisphenol. Additionally or alternatively, the molding material 126 can include inorganic filler, catalyst, flame retardant, stress modifier, and/or an adhesion promoter, among others. The molding material 126 provides a support structure for the foil 104. The molding material 126 can help prevent electrical connections (traces, pads, vias, or the like) from shorting.

The molding material 126 can be injected through a mold runner 123, such as shown in FIG. 1F. A mold vent 125 can allow air to escape during molding material 126 injection. FIG. 1F illustrates a cross-section diagram of an embodiment of a system 100F that includes the mold runner 123 and the mold vent 125.

FIG. 1G illustrates an embodiment of a system 100G that includes the system 100E or 100F after the top mold chase 102A has been removed and during a die singulation process. The foil 104 is attached to the pad 116 through the conductive adhesive 114. Conductive connectors 122 can be attached to the strip 110, such as before or after the die singulation process. The conductive connectors 122 can include ball grid array (BGA), land grid array, or other electrical connections. The conductive connectors 122 can be electrically coupled or connected to connection circuitry in the strip 110 and/or one or more of the connections 118.

The die singulation process can include cutting all the way through the strip 110 to separate packages 112 and associated connection circuitry in the strip 110. The die singulation can be performed with a saw, bevel, laser ablation, scribe and cleave, or the like. A die package singulated with a portion of the strip 110 and with or without the connectors 122 is sometimes referred to as a SiP herein.

FIG. 1H illustrates a system 100H that includes a package 112 with EMI shielding. The foil 104 attached to the grounding pads 116 provides a grounded EMI shielding around the package 112, such as to help reduce an amount of EMI on the die package 112. The foil 104 can at least partially surround the package 112, such as to surround the die package 112 on up to five sides (any sides with the exception of the bottom side where the package 112 is attached to the connections 118).

FIG. 1I illustrates, by way of example, a perspective view diagram of an embodiment of a system 100I that is an embodiment of the system 100H viewed in the direction of arrow labelled "1I/1J" in FIG. 1H. The foil 104 and conductive adhesive 114 are transparent so as to not obscure a view of the grounding pads 116. In one or more embodiments, the grounding pads 116 can be situated around the package 112, such as to provide multiple connection points for the foil 104. The grounding pads 116 help keep the foil 104 attached to the strip 110, such as to completely surround the package 112.

FIG. 1J illustrates, by way of example, a perspective view diagram of an embodiment of a system 100J that is an embodiment of the system 100H viewed in the direction of arrow labelled "1I/1J" in FIG. 1H. In the embodiment of the system 100J, the grounding pad 116 is a single conductive pad around an entire perimeter of the package 112.

Figures 2A, 2B:
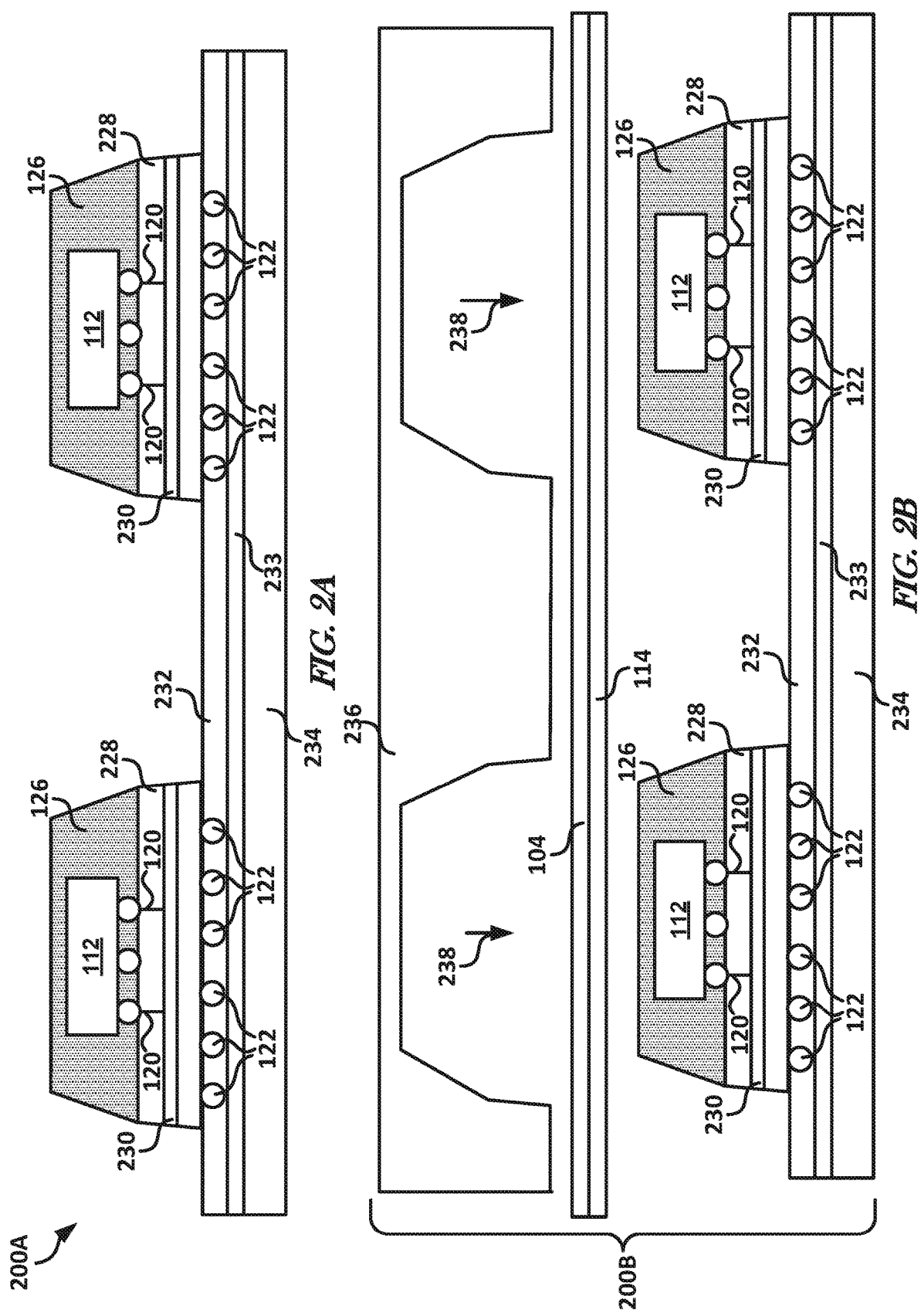

FIG. 2A illustrates, by way of example, a cross-section diagram of an embodiment of a system 200A for EMI shielding. The system 200A as illustrated includes multiple SiPs on a carrier 232 that is on a redistribution panel 234. The carrier 232 can be coupled to the redistribution panel 234 through a tacky material 233.

Each of the SiPs, as illustrated, includes a substrate 228, a package 112, and a molding material 126 over and around the package 112 and between the connections 118 (connections not labelled in FIG. 2A so as to not obscure the view, see FIGS. 1C-1H for a view of the connections 118). Each of the packages includes the connectors 122 attached thereto. In the embodiments of the FIGS. 1A-1J, the substrate is provided by the strip 110.

A ground plane 230 is situated in the substrate 228. The ground plane 230 can include a variety of shapes, such as one of those shown in FIGS. 3A-3D, among others. The die packages 112 are electrically coupled to the ground plane 230 through the traces 120.

The carrier 232 is a material that provides an area on which the packages can be placed and pressed between a mold chase 236 and the redistribution panel 234, such as without slipping or damaging the connectors 122. The carrier 232 can include an elastomeric material, such as to help cushion the packages under pressure from the top mold chase 236 (see FIG. 2B).

The tacky material 233 (e.g., an adhesive) can be coated or otherwise situated on the redistribution panel 234. The tacky material 233 can include a thermal release tape, thermoplastic, polyimide adhesive film, Poly-vinyl chloride (PVC) film, pressure sensitive acrylic based adhesive, ultraviolet (UV) release film, and/or a polyester based adhesive, among others. Objects can be coupled to the redistribution panel 234 through the tacky material 233.

The redistribution panel 234 is a sheet of material on which packages are placed in specific (precise) x-y locations. The redistribution panel 234 can include a material on which the carrier 232 can be adhered or situated. The redistribution panel 234 is a relatively rigid material that can be transported without deforming or altering the location of the packages on the carrier 232.

FIG. 2B illustrates, by way of example, a cross-section diagram of an embodiment of a system 200B for adhering a foil 104 to a SiP. The system 200B as illustrated includes the top mold chase 236, the foil 104, and the conductive adhesive 114. The top mold chase 236 is used to form the foil 104 to a shape defined by the top mold chase 236 and the SiP. The top mold chase 236 is pressed on the SiPs in the direction of arrows 238. The conductive adhesive 114 contacts the grounding plane 230 and forms an electrical path between the foil 104 and the grounding plane 230. While FIG. 2B illustrates the conductive adhesive 114 as being on the foil 104, the conductive adhesive 114 can alternatively be situated on edges of the grounding plane 230.

FIG. 2C illustrates, by way of example, a cross-section diagram of an embodiment of a system 200C that includes the system 200B after the top mold chase 236 is pressed to adhere the foil 104 to the grounding plane 230. Heat can be applied to the system 200B and/or 200C to activate the conductive adhesive 114. The system 200C can be cooled, such as to solidify a bond between the foil 104 and the grounding plane 230 formed by the conductive adhesive 114. FIG. 2D illustrates, by way of example, a cross-section diagram of an embodiment of a system 200D that includes the system 200C after the top mold chase 236 is removed therefrom.

FIG. 2E illustrates, by way of example, a system 200E that includes the system 200D during a die singulation process. The die singulation process can include cutting all the way through the foil 104 and the adhesive 114 to separate the SiPs. The die singulation can be performed with saw, bevel, laser ablation, scribe and cleave, or the like.

FIG. 2F illustrates a system 200F that includes a SiP with EMI shielding. The foil 104 attached to the grounding plane 230 (via the conductive adhesive 114) provides a grounded shielding at least partially around the package 112, such as to help reduce an amount of EMI that affects the SiP. The foil 104 can at least partially surround the package 112. In the embodiment illustrated in FIG. 2F, the foil 104 surrounds the entire package except for a bottom surface of the substrate 228 (the surface on which the connectors 122 are attached).

The process illustrated in FIGS. 2A-2E produces a system with a different configuration than the process illustrated in FIGS. 1A-G. For example, the foil 104 of the process of FIGS. 2A-2E need not have the mold runner 123 or the mold vent 125 because the package is molded prior to foil attach. Another example difference includes the attachment location of the foil 104. In the system 100H, the foil 104 is attached to a grounding pad 116 exposed at a top surface of the strip 110, while in the system 200F, the foil 104 is attached to a grounding plane 230 that is under the surface of the substrate 228 and exposed at edges of the substrate 228.

FIGS. 3A, 3B, 3C, and 3D illustrate, by way of example, various embodiments of grounding planes 230A, 230B, 230C, and 230D configurations, respectively. FIG. 3A illustrates, by way of example, an embodiment of a grounding plane 230A that spans an entirety of a layer of the substrate 228. In such an embodiment, a via 334 and a dielectric isolation 336 can be used to pass signals through the grounding plane 230A.

FIG. 3B illustrates, by way of example, an embodiment of a grounding plane 230B that does not span an entirety of a layer of the substrate 228. In such an embodiment, vias 334 outside of the grounding plane 230B can pass between layers without needing to pass through the grounding plane 230B.

FIGS. 3C and 3D illustrate, by way of example, of embodiments of grounding planes 230C and 230D that include irregular configurations. Such embodiments are intended to illustrate that the grounding plane 230 can take any general form as long as it is exposed along edges of the substrate 228.

Using a film or foil in place of a sputtered material as described with regard to the preceding FIGS. provides a more robust (e.g., stronger, harder to break, more reliable, or the like) EMI shielding. Unlike with sputtering material, a wider variety of metal and/or alloy compositions can be used. Using a film or foil, the thickness of the EMI shielding is not limited like it is using a sputtered material. The foil or film is generally denser and has fewer defects, such as voids, cracks, or other defects. Such defects can be detected using a microscope or inspection by the naked eye. The foil or film generally has a more uniform thickness over a curved surface as compared to a sputtered material. Such differences make the foil or film as discussed herein physically different from a sputtered material. Such differences can be detected by the naked eye or with the aid of a microscope.

Figure 4:
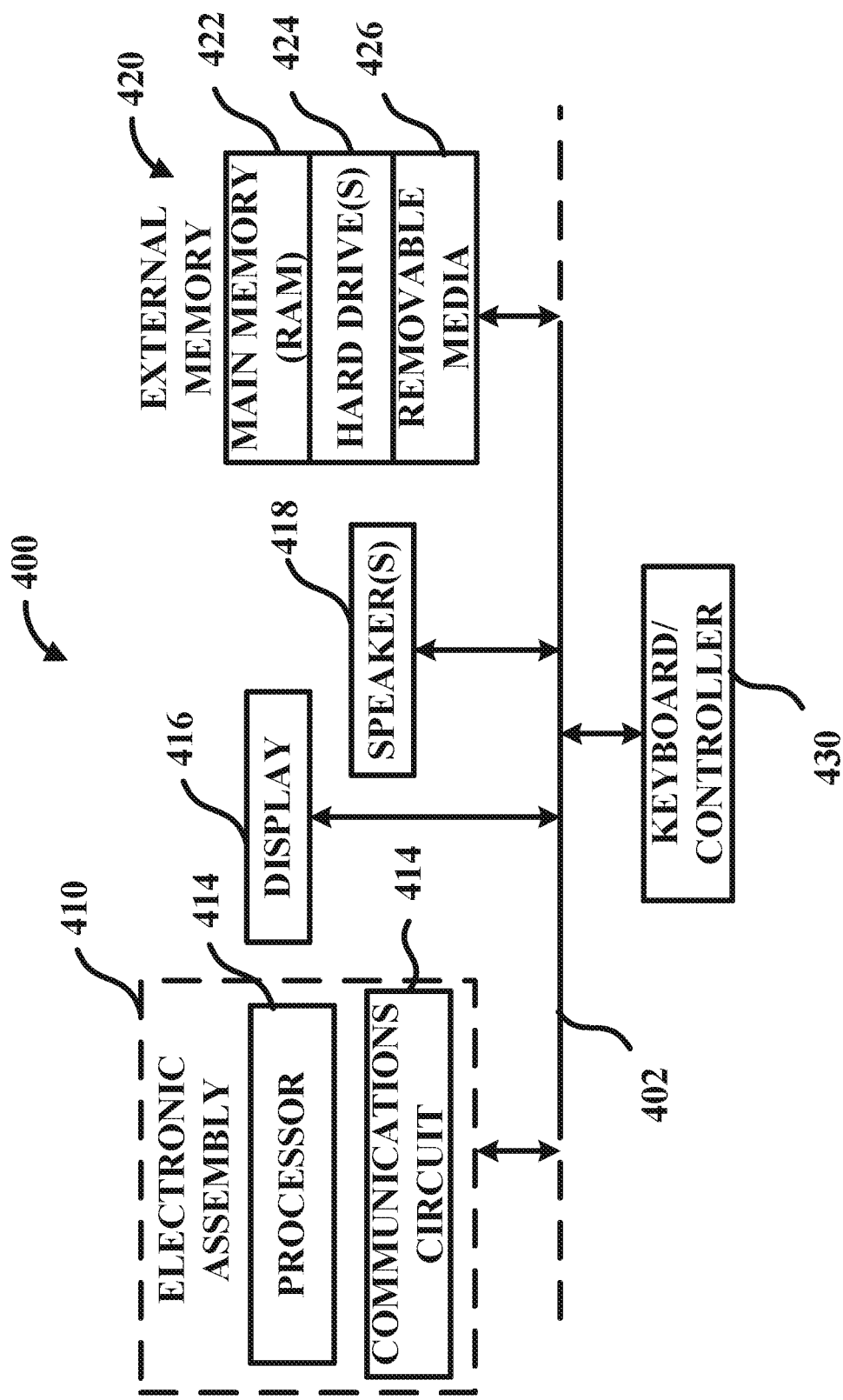
FIG. 4 shows a block diagram example of an electronic device which can include a component with EMI shielding.

FIG. 4 shows a block diagram example of an electronic device which can include an EMI shielding as disclosed herein. An example of an electronic device using one or more packages with one or more higher resistance via is included to show an example of a device application for the present disclosure. Electronic device 400 is merely one example of a device in which embodiments of the present disclosure can be used. Examples of electronic devices 400 include, but are not limited to, personal computers, tablet computers, supercomputers, servers, telecommunications switches, routers, mobile telephones, personal data assistants, MP3 or other digital music players, radios, or the like.

In the example of FIG. 4, electronic device 400 comprises a data processing system that includes a system bus 402 to couple the various components of the system. System bus 402 provides communications links among the various components of the electronic device 400 and can be implemented as a single bus, as a combination of busses, or in any other suitable manner.

An electronic assembly 410 is coupled to system bus 402. The electronic assembly 410 can include a circuit or combination of circuits. In one embodiment, the electronic assembly 410 includes a processor 412 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 410 are a custom circuit, an application-specific integrated circuit (ASIC), or the like, such as, for example, one or more circuits (such as a communications circuit 414) for use in wireless devices like mobile telephones, pagers, personal data assistants, portable computers, two-way radios, and similar electronic systems. The IC can perform any other type of function.

The electronic device 400 can include an external memory 420, which in turn can include one or more memory elements suitable to the particular application, such as a main memory 422 in the form of random access memory (RAM), one or more hard drives 424, and/or one or more drives that handle removable media 426 such as compact disks (CD), digital video disk (DVD), and the like.

The electronic device 400 can also include a display device 416, one or more speakers 418, and a keyboard and/or controller 430, which can include a mouse, trackball, touch screen, voice-recognition device, or any other device that permits a system user to input information into and receive information from the electronic device 400.

ADDITIONAL NOTES AND EXAMPLES

In Example 1 a device with electromagnetic interference (EMI) shielding can include a substrate including electrical connection circuitry therein, grounding circuitry on, or at least partially in the substrate, the grounding circuitry at least partially exposed from a surface of the substrate, a die electrically connected to the connection circuitry and the grounding circuitry, the die on the substrate, and a conductive foil or conductive film surrounding the die, the conductive foil or conductive film electrically connected to the grounding circuitry.

In Example 2 the device of Example 1 can include, wherein the conductive foil or conductive film surrounds the die package on five sides of the die.

In Example 3 the device of at least one of Examples 1-2 can include, wherein the conductive foil or conductive film is a conductive foil.

In Example 4 the device of at least one of Examples 1-2 can include, wherein the conductive foil or conductive film is a conductive film.

In Example 5 the device of at least one of Examples 1-4 can include, wherein the grounding circuitry is a grounding plane in the substrate.

In Example 6 the device of at least one of Examples 1-4 can include, wherein the grounding circuitry is one or more grounding pads on a top surface of the substrate, the top surface of the substrate facing the die.

In Example 7 the device of at least one of Examples 1-6 can include one or more solder balls electrically and mechanically connected to a bottom surface of the substrate, the bottom surface of the substrate opposite a/the top surface of the substrate.

In Example 8 the device of at least one of Examples 1-7 can include a mold runner hole and a mold vent hole in the conductive foil or the conductive film, and a molding material on and around the die, the molding material in contact with the die and the conductive foil or film.

In Example 9 the device of at least one of Examples 1-5 and 7-8 can include, wherein the grounding circuitry is a grounding plane and the device further comprises a layer of conductive adhesive between the conductive foil or conductive film and the grounding plane, the conductive foil or conductive film and the substrate, and the conductive foil or conductive film and the molding material.

In Example 10 a method for providing electromagnetic interference (EMI) shielding for a System in Package (SiP) can include pressing an adhesive and a conductive foil or conductive film onto a mold chase so as to adhere the conductive foil to the mold chase, aligning a strip of dies with the mold chase, pressing the mold chase with the conductive foil adhered thereto onto the strip of dies to form and electrical connection between the conductive foil and grounding pads on the strip, injecting molding material between the conductive foil or conductive film and the dies after pressing the mold chase onto the strip, and singulating the dies from the strip.

In Example 11 the device of Example 10 can include heating solder on the grounding pads to melt the solder, and cooling the solder to solidify the electrical connection between the conductive foil or conductive film and the grounding pads.

In Example 12 the device of at least one of Examples 10-1.1 can include heating the adhesive to reduce a bond strength between the conductive foil or conductive film and the mold chase.

In Example 13 the device of at least one of Examples 10-12 can include, wherein injecting the molding material includes injecting the molding material into a mold runner hole in the conductive film or conductive foil.

In Example 14 the device of at least one of Examples 10-13 can include electrically connecting solder balls to a bottom surface of the strip before singulating the dies, the bottom surface of the strip opposite a surface of the strip on which the conductive foil or conductive film is electrically connected.

In Example 15 the device of at least one of Examples 10-14 can include electrically connecting solder balls to a bottom surface of the strip after singulating the dies, the bottom surface of the strip opposite a surface of the strip on which the conductive foil or conductive film is electrically connected.

In Example 16 a method for providing electromagnetic interference (EMI) shielding for a System in Package (SiP) can include situating a conductive film or conductive foil under a mold chase, aligning a redistribution panel with dies thereon with the mold chase, each of the dies including a molding material around a respective die, pressing the mold chase towards the redistribution panel to form an electrical connection between the conductive foil or conductive film and the grounding planes of the dies, and singulating the die packages by cutting through the conductive foil or conductive film between respective dies.

In Example 17 the device of Example 16 can include, wherein the conductive foil or conductive film includes a layer of conductive adhesive on a surface of the conductive foil or conductive film facing the dies.

In Example 18 the device of Example 17 can include, wherein after pressing the mold chase towards the redistribution panel the conductive adhesive is further situated between the conductive foil or conductive film and the molding material of the dies.

In Example 19 the device of Example 16 can include, wherein the grounding planes include conductive adhesive thereon prior to pressing the mold chase towards the redistribution panel and the conductive foil or conductive film does not include conductive thereon prior to pressing the mold chase towards the redistribution panel to form the electrical connection between the conductive foil or conductive film and the grounding planes.

In Example 20 the device of at least one of Examples 16-19 can include situating the dies on a carrier on the redistribution panel, the carrier including an elastomeric material to protect the dies while pressing the mold chase.

The above description of embodiments includes references to the accompanying drawings, which form a part of the description of embodiments. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above description of embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the description of embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method for providing electromagnetic interference (EMI) shielding for a System in Package (SiP), the method comprising:
    pressing an adhesive and a conductive foil or conductive film onto a mold chase so as to adhere the conductive foil to the mold chase;
    aligning a strip of dies with the mold chase;
    pressing the mold chase with the conductive foil adhered thereto onto the strip of dies to form an electrical connection between the conductive foil and ground pads on the strip; and
    singulating the dies from the strip.

2. The method of claim 1, further comprising injecting molding material between the conductive foil or conductive film and the dies after pressing the mold chase onto the strip.

3. The method of claim 1, wherein the molding material is injected through a mold runner in the mold chase and the conductive foil or conductive film.

4. The method of claim 3, further comprising venting excess air through a mold vent in the mold chase and the conductive foil or conductive film.

5. The method of claim 1, further comprising:
    heating solder on the grounding pads to melt the solder; and
    cooling the solder to solidify the electrical connection between the conductive foil or conductive film and the grounding pads.

6. The method of claim 1; further comprising:
    heating the adhesive to reduce a bond strength between the conductive foil or conductive film and the mold chase.

7. The method of claim 1, further comprising electrically connecting solder balls to a bottom surface of the strip before singulating the dies, the bottom surface of the strip opposite a surface of the strip on which the conductive foil or conductive film is electrically connected.

8. The method of claim 1, further comprising electrically connecting solder balls to a bottom surface of the strip after singulating the dies, the bottom surface of the strip opposite a surface of the strip on which the conductive foil or conductive film is electrically connected.

9. The method of claim 1, wherein:
    the mold chase includes a top mold chase and a bottom mold chase;
    pressing the adhesive and the conductive foil or conductive film onto the mold chase so as to adhere the conductive foil to the mold chase includes pressing the adhesive and the conductive foil or conductive film to the top mold chase; and the method further comprises pulling the bottom mold chase away from the top mold chase leaving the adhesive and the conductive foil or conductive film adhered to the top mold chase.

10. The method of claim 1, wherein the conductive foil includes a conductive material and the conductive film includes the conductive foil attached to a bonding material.

11. A method for providing electromagnetic interference (EMI) shielding for a System in Package (SiP), the method comprising:

pressing an adhesive and a conductive foil or conductive film onto a mold chase so as to adhere the conductive foil to the mold chase;

aligning a redistribution panel with dies thereon with the mold chase;

pressing the mold chase towards the redistribution panel to form an electrical connection between the conductive foil or conductive film and respective grounding planes of the dies; and singulating the die packages by cutting through the conductive foil or conductive film between respective dies.

12. The method of claim 11, further comprising:

heating the conductive adhesive to activate conductive adhesive on the respective grounding planes; and cooling the conductive adhesive to solidify the electrical connection between the conductive foil or conductive film and the respective grounding planes.

13. The method of claim 11, wherein the respective grounding planes include the conductive adhesive thereon prior to pressing the mold chase towards the redistribution panel to form the electrical connection between the conductive foil or conductive film and the grounding planes.

14. The method of claim 13, further comprising:

heating the conductive adhesive to activate the conductive adhesive; and cooling the conductive adhesive to solidify the electrical connection between the conductive foil or conductive film and the respective grounding planes.

15. The method of claim 14, wherein the respective grounding planes are under a surface of a substrate of the die and exposed at edges of the substrate and heating and cooling the conductive adhesive forms an electrical connection at the exposed portions of the respective grounding planes.

16. The method of claim 11, further comprising:

situating the dies on a carrier on the redistribution panel, the carrier including an elastomeric material to protect the dies while pressing the mold chase.

17. The method of claim 16, further comprising adhering the carrier to the redistribution panel using a tacky material.

* * * * *